(12) United States Patent
Thomas

(10) Patent No.: US 11,502,645 B1
(45) Date of Patent: *Nov. 15, 2022

(54) TRANSFORMER VOLTAGE CONTROLLED OSCILLATOR

(71) Applicant: IQ-Analog Corporation, San Diego, CA (US)

(72) Inventor: Devon Thomas, San Diego, CA (US)

(73) Assignee: IQ-Analog Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/842,290

(22) Filed: Jun. 16, 2022

Related U.S. Application Data

(63) Continuation of application No. 17/715,147, filed on Apr. 7, 2022, now Pat. No. 11,405,000.

(51) Int. Cl.
  *H03B 5/12* (2006.01)
  *H03B 5/18* (2006.01)

(52) U.S. Cl.
  CPC ......... *H03B 5/1296* (2013.01); *H03B 5/1228* (2013.01); *H03B 5/1243* (2013.01); *H03B 5/1852* (2013.01); *H03B 2200/003* (2013.01)

(58) Field of Classification Search
  CPC .. H03B 5/1296; H03B 5/1228; H03B 5/1243; H03B 5/1852; H03B 200/003
  USPC .................................. 331/167, 177 V, 116 FE
  See application file for complete search history.

(56) References Cited

U.S. PATENT DOCUMENTS

| | | | |
|---|---|---|---|
| 9,312,807 B2 | 4/2016 | Shirinfar et al. | |
| 9,385,650 B2 | 7/2016 | Shi et al. | |
| 11,405,000 B1* | 8/2022 | Thomas | H03B 5/1296 |
| 2012/0161890 A1* | 6/2012 | Li | H03B 5/1256 |
| | | | 331/117 FE |

OTHER PUBLICATIONS

B. Razavi, "Cognitive Radio Design Chaitenges and Techniques," IEEE Journal of Solid-State Circuits, vol. 45, No. 8, pp. 1542-1553, Aug. 2010, doi: 10.1109/JSSC.2010.2049790.

(Continued)

*Primary Examiner* — Arnold M Kinkead
(74) *Attorney, Agent, or Firm* — Law Office of Gerald Maliszewski; Gerald Maliszewski

(57) ABSTRACT

A transformer based voltage controlled oscillator (VCO) is provided with a primary resonant circuit having a first inductor connected in parallel with a variable first capacitance circuit. A secondary resonant circuit is formed from a second inductor connected in parallel with a variable second capacitance circuit, and also includes a mode control circuit. The mode control circuit controls the direction of current flow through the secondary resonant circuit inductor. The first and second inductors are inductively mutually coupled in either an even mode or an odd mode in response to the mode control circuit. The VCO supplies a first resonant frequency in response to even mode operation, or a second resonant frequency, greater than the first resonant frequency, responsive to odd mode operation. The VCO may include a first electrically tunable varactor shunted across the first capacitance circuit and a second electrically tunable varactor shunted across the second capacitance circuit.

35 Claims, 7 Drawing Sheets

(56) References Cited

OTHER PUBLICATIONS

M. Raj, P. Upadhyaya et al., "A 7-to-18.3GHz compact transformer based VCO in 16nm FinFET," 2016 IEEE Symposium on VLSI Circuits (VLSI-Circuits), 2016, pp. 1-2.
O. El-Aassar et al., "A Dual-Core 8-17 GHz LC VCO with Enhanced Tuning . . . ," 2020 IEEE Radio Frequency Integrated Circuits Symposium (RFIC), 2020, pp. 247-250.
Razavi, Behzad. "Chapter 13 Transceiver Design Example." RF Microelectronics, Pearson Education International, Upper Saddle River (N.J.), 2012.
Razavi, Behzad. "Chapter 8 Transceiver Oscillators." RF Microelectronics, Pearson Education International, Upper Saddle River (N.J.), 2012.

* cited by examiner

TRANSFORMER VOLTAGE CONTROLLED OSCILLATOR

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to voltage controlled oscillators (VCOs) and, more particularly, to a wideband frequency transformer based VCO.

2. Description of the Related Art

FIG. 1 is a schematic drawing depicting a conventional voltage controlled oscillator (VCO) using a single inductor-capacitor (LC) tank with fixed value capacitors 100 for coarse frequency selection and varactors 102 for fine frequency selection to cover the frequency range (prior art).

High-performance phase-locked loops (PLLs), in terms of both frequency and time jitter, require ultra-wideband VCOs to produce low phase-noise. These requirements are generally achieved using either large varactors or a large number of discrete tuning capacitors. Additionally, two or more independent VCO cores might be used in integrated PLLs. However, large varactors contribute significantly to phase noise degradation by increasing the gain of the VCO (Kvco), where Kvco describes the range of frequencies the VCO is able to cover in response to input voltage. Consequently, the transfer of varactor biasing resistor noise and flicker noise modulate the output frequency. Further, the LC tank quality factor (Q) is degraded when the varactor capacitance is an appreciable portion of the overall tank capacitance, as the Q of the varactors is less than that of fixed value capacitors. However, if a large number of discrete tuning capacitors are used instead, the complexity of layout increases and parasitic capacitance is added that also degrades the tank's quality factor.

One conventional approach to creating an ultra-wideband frequency coverage PLL utilizes multiple independent VCO cores. Overlapping these independent VCOs gives the appearance of continuous frequency coverage. Independent VCO cores generally have higher phase noise (PN) performance due to the quality factor of the tank and reduced capacitive load range, which allows the design to use relatively small value varactors appropriate for single band VCO cores. However, each LC oscillator consumes extra area because generally the inductor requires 50% or more of the PLL area.

U.S. Pat. No. 9,312,807 addresses the problem of how to feed the output of independent VCOs, each with a unique fundamental frequency (and range), to the same output node. The invention is a combination of a transformer that couples N independent VCOs and a control scheme that disables unused VCO cores, so that only one VCO core is enabled at any particular time. However, each VCO still requires its own inductor, so the circuitry takes up a lot of area on a circuit board.

It would be advantageous if the frequency range of a PLL could be increased by using transformer-connected VCO cores able to control the transformed mode of operation.

It would be advantageous if the frequency range of a PLL could be widened using multiple VCO cores "sharing" inductance.

SUMMARY OF THE INVENTION

Described herein are a system and method for controlling the primary and secondary capacitive loading of a transformer to accomplish finer discrete frequency steps that, in turn, enable the use of smaller varactors in the design of voltage controlled oscillators (VCOs). Reducing the varactor size reduces the VCO gain (Kvco), as well as the contribution of biasing thermal noise and flicker noise. In addition to coupled inductors (i.e., a transformer), a transformer based VCO differs from a conventional inductor-capacitor (LC) VCO by the inclusion of an auxiliary amplifier to control the direction of current flow. A transformer based VCO has both an even-mode and odd-mode resonance determined by the phase relationship of the currents in the primary and secondary coils that make up the transformer. When operating in the odd mode, the effective inductance is reduced and thus a higher oscillation frequency is created. Enforcement of in-phase or anti-phase coupling leads to upper and lower resonant bands, enabling very wideband architectures with the advantage of occupying the area of a single inductor. In contrast to the circuitry presented in U.S. Pat. No. 9,312,807, presented above, the system described herein includes two or more VCO cores simultaneously connected to the primary and secondary coils of the transformer, along with even and odd mode enforcement, allowing the transformer feedback to be leveraged and create intermediate oscillation frequencies through independent control of the independent VCO capacitive loads.

Accordingly, a transformer based voltage controlled oscillator is provided with a primary resonant circuit formed with a first inductor connected in parallel with a variable first capacitance circuit. A secondary resonant circuit is formed from a second inductor connected in parallel with a variable second capacitance circuit, and also includes a mode control circuit. The mode control circuit controls the direction of current flow through the secondary resonant circuit inductor. The first and second inductors are inductively mutually coupled in either an even mode or an odd mode in response to the mode control circuit. The VCO supplies a variable (i.e., selectable) frequency output signal responsive to the mutual inductance of the first and second inductors, the first capacitance circuit, and the second capacitance circuit. More explicitly, the VCO supplies a first resonant frequency in response to even mode operation, or a second resonant frequency, greater than the first resonant frequency, in response to odd mode operation. Variations in the first and second resonant frequencies are a result of the first and second capacitance circuits. The first and second capacitance circuits may be independently controlled.

Typically, the first capacitance circuit is formed from a bank of selectively engageable fixed-value capacitors. The second capacitance circuit is likewise typically formed from a second bank of selectively engageable fixed-value capacitors. The capacitors in the first and second capacitance circuits are configured in parallel, serial, or combinations of serial and parallel connections. In one aspect, the VCO further includes a first electrically tunable varactor shunted across the first capacitance circuit and a second electrically tunable varactor shunted across the second capacitance circuit. Advantageously, the capacitor banks include a range of capacitors with a largest capacitance step between consecutive fixed values greater than the varactor maximum tuned capacitances. Thus enabled, the VCO is able to supply a first continuous range of frequencies, ascending from the first resonant frequency, in response to even mode operation, the first and second capacitance circuits, and electrically tuned capacitance values of the first and second varactors. Further, the VCO supplies a second continuous range of frequencies, ascending from the second resonant frequency, in response to odd mode operation, the first and second capacitance circuits, and electrically tuned capacitance values of the first and second varactors. In one aspect the first and second continuous range of frequencies, when combined, form a third continuous range of frequencies.

More generally, the VCO may be formed from (n−1) number of secondary resonant circuits, with each secondary resonant circuit including a mutually coupled inductor, a variable capacitance circuit, and a mode control circuit. As a result, the VCO is able to supply n resonant frequencies in response to n resonant circuits, and variations to the n resonant frequencies in response to n capacitance circuits. In one variation an electrically tunable varactor may be shunted across each corresponding capacitance circuit.

Additional details of the above-described VCO, as well as a transformer based method for voltage controlled oscillation are provided below.

DETAILED DESCRIPTION

Figure 2:
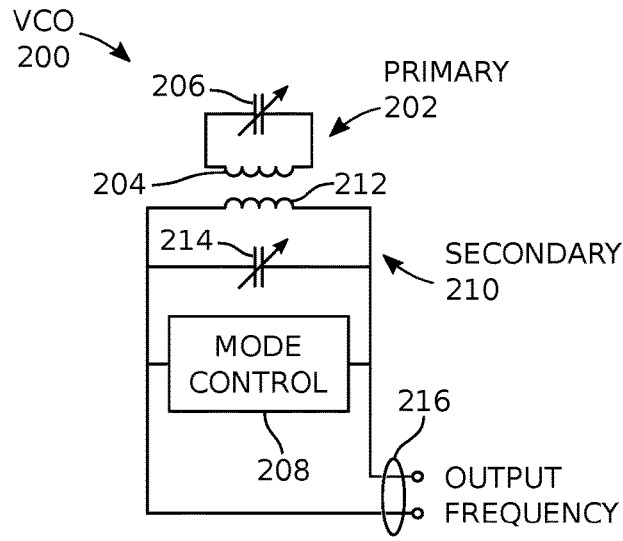
FIG. 2 is a schematic block diagram depicting a transformer based voltage controlled oscillator (VCO).

FIG. 2 is a schematic block diagram depicting a transformer based voltage controlled oscillator (VCO). The VCO 200 comprises a primary resonant circuit 202 comprising a first inductor 204 connected in parallel with a variable first capacitance circuit 206. A secondary resonant circuit 210 comprises a second inductor 212 connected in parallel with a variable second capacitance circuit 214, and a mode control circuit 208. The first inductor 204 and second inductor 212 are inductively mutually coupled in either an even or odd mode in response to the mode control circuit. Alternatively stated, the mode control circuit 208 controls the direction of current flow through the secondary resonant circuit inductor, second inductor 212. As used herein, current flow through the mutually coupled inductors 204/212 that increases the first and second inductance values is referred to as the even mode, while current flow through the mutually coupled inductors that decreases the first and second inductance values is referred to as the odd mode. The VCO 200 supplies a variable (i.e., selectable) frequency output signal on output interface 216 responsive to the mutual inductance of the first and second inductors 204/212, the first capacitance circuit 206, and the second capacitance circuit 214. More explicitly, the VCO 200 supplies a first resonant frequency in response to even mode operation, or a second resonant frequency, greater than the first resonant frequency, in response to odd mode operation, with variations to the first and second resonant frequencies in response to the first and second capacitance circuits 206/214.

Figure 3:
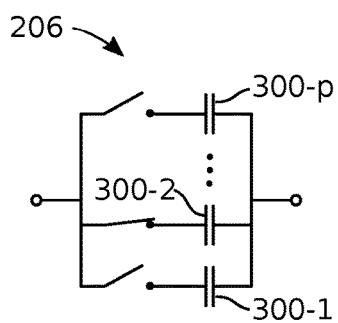
FIG. 3 is a schematic diagram depicting the first capacitor circuit.

FIG. 3 is a schematic diagram depicting the first capacitor circuit. Typically, the first capacitance circuit 206 comprises a first bank of selectively engageable fixed-value capacitors 300-1 through 300-p. Although not explicitly depicted, the second capacitance circuit can be enabled in the same manner. The capacitors in the first capacitance circuit 206 are shown in an arrangement of selectable parallel capacitors. However, the capacitors may be arranged in parallel, serial, or combinations of serial and parallel, as would be understood by one with ordinary skill in the art. Typically, the first and second capacitance circuits are independently controlled, that is, tuned to different capacitance values.

Figure 4:
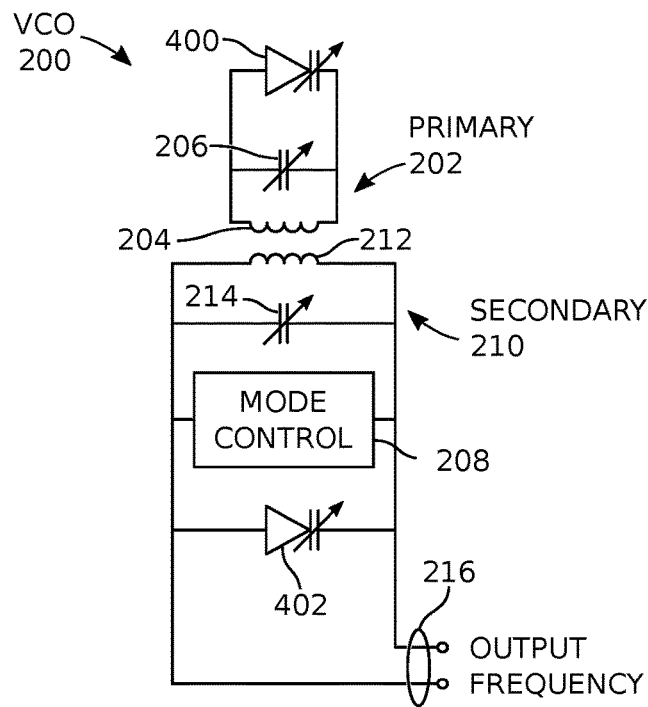
FIG. 4 is a schematic diagram depicting a variation of the VCO of FIG. 2.

FIG. 4 is a schematic diagram depicting a variation of the VCO of FIG. 2. In this aspect a first electrically tunable varactor (varicap) 400 is shunted across the first capacitance circuit 206. Likewise, a second electrically tunable varactor 402 is shunted across the second capacitance circuit 214. Alternatively but not shown, in some aspects the varactors may be arranged in series with the capacitance circuits, or in parallel or series with only some of the capacitors in the capacitance circuits. A varactor functions as a capacitor whose capacitance value can be tuned in response to a supplied dc voltage.

Figure 5A:
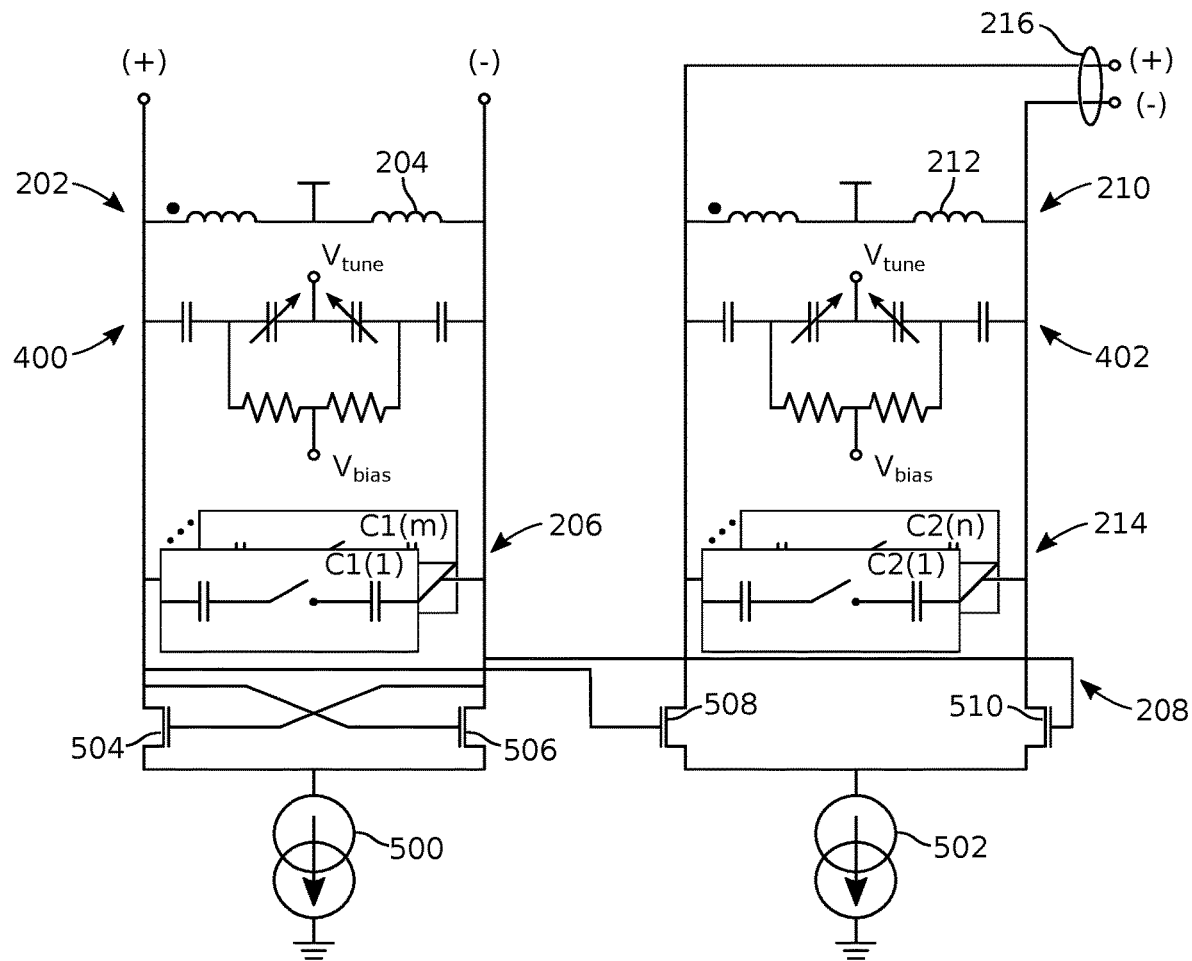
FIGS. 5A and 5B are schematic diagrams depicting the VCO of FIG. 4 in greater detail.
Figure 5B:
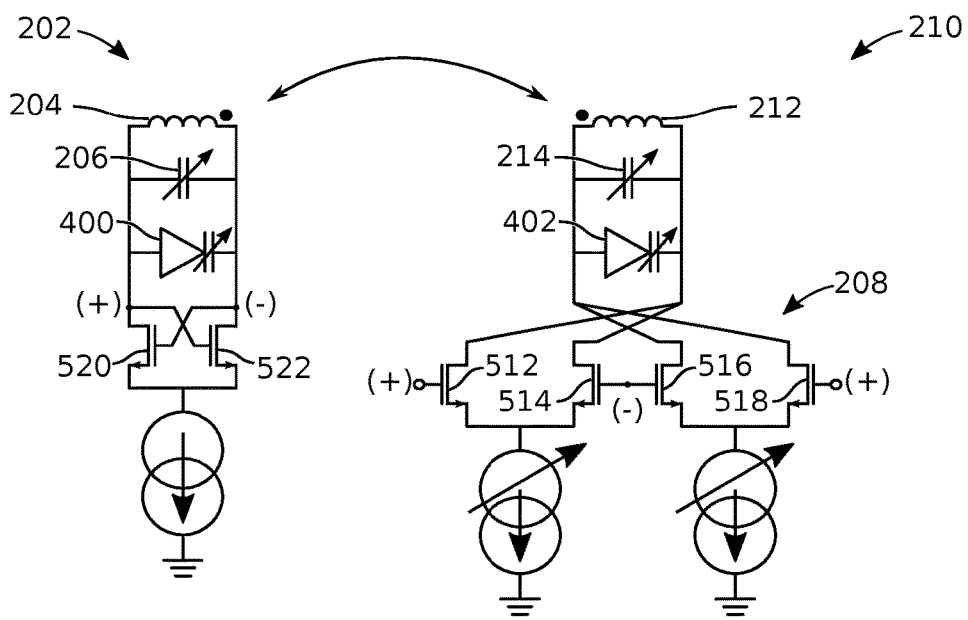

FIGS. 5A and 5B are schematic diagrams depicting the VCO of FIG. 4 in greater detail. In FIG. 5A the primary resonant circuit 202 is shown connected to voltage potentials (+) and (−). Likewise, the secondary resonant circuit 210 is shown connected between voltage potentials (+) and (−). The mode control circuit in this example changes the direction of current flow in response to the voltage potential polarity switching in the primary resonant circuit. Also shown are current sources 500 and 502, and field effect transistors (FETs) 504, 506, 508, and 510. The alignment of the coupled inductors is indicated by the adjacent circles.

FIG. 5B depicts another variation of the mode control circuit 208. As in FIG. 5A the mode control circuit in this example changes the direction of current flow in response to the voltage potential polarity switching in the primary resonant circuit. Alternatively, the voltage polarity of the primary resonant circuit remains constant and either transistor pair 512/514 or 516/518 is enabled (e.g., with switches, not shown) to change modes.

In one aspect, the first bank of capacitors 206 may comprise a first range of capacitors with the largest capacitance step between consecutive fixed values greater than the first varactor 400 maximum tuned capacitance. Likewise, the second bank of capacitors 214 may comprise a second range of capacitors with a largest step between consecutive fixed values greater than or equal to the second varactor 402 maximum tuned capacitance. As explained in more detail below, this relationship improves the overall quality factor (Q) of the circuit.

Figure 6:
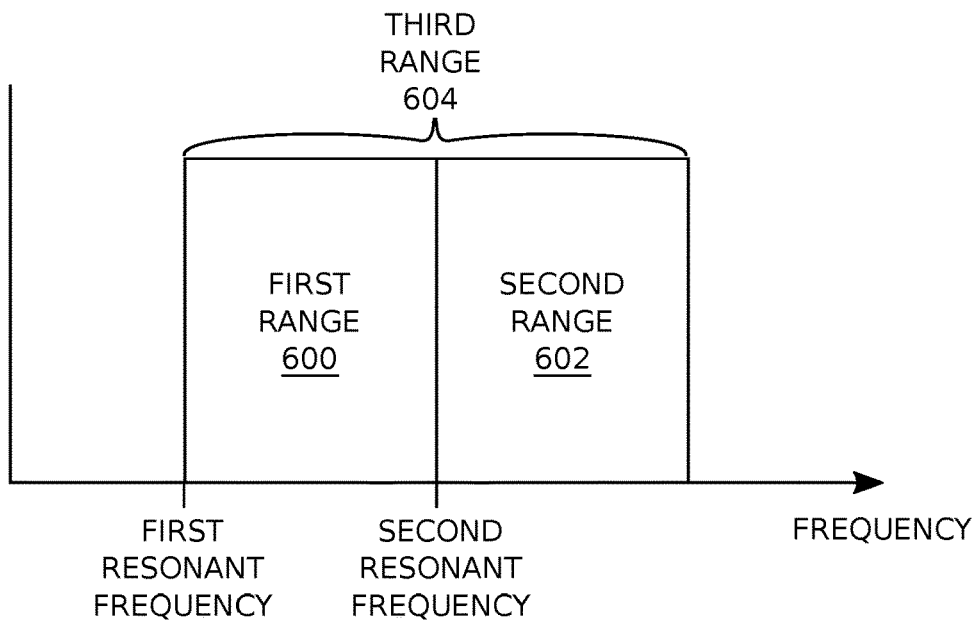
FIG. 6 is a graph depicting an exemplary range of output frequencies supplied by the VCO.

FIG. 6 is a graph depicting an exemplary range of output frequencies supplied by the VCO. In this example the VCO supplies a first continuous range of frequencies 600, ascending from the first resonant frequency, in response to even mode operation, the first and second capacitance circuits, and electrically tuned capacitance values of the first and second varactors. Alternatively, the VCO supplies a second continuous range of frequencies, ascending from the second resonant frequency, in response to odd mode operation, the first and second capacitance circuits, and electrically tuned capacitance values of the first and second varactors. In one aspect, as shown, the first continuous range of frequencies 600 and second continuous range of frequencies 602, when combined, form a third continuous range of frequencies 604. Although not explicitly depicted, the first and second frequency ranges may overlap, as explained in greater detail below.

Figure 7:
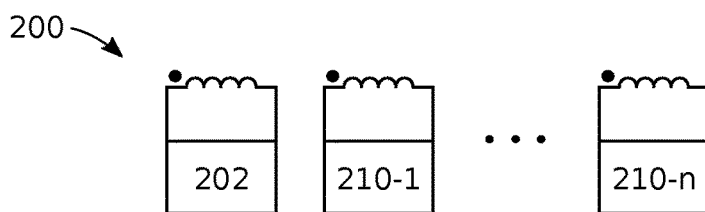
FIG. 7 is a schematic block diagram of the VCO employing multiple secondary resonant circuits.

FIG. 7 is a schematic block diagram of the VCO employing multiple secondary resonant circuits. More generally, the VCO 200 may be comprised of one primary resonant circuit 202 and (n−1) number of (non-identical) secondary resonant circuits 210-1 through 210-(n−1), with each secondary resonant circuit comprising a mutually coupled inductor, a variable capacitance circuit, and a mode control circuit, as shown in FIG. 2. Assuming that each secondary resonant circuit is only coupled to the primary resonant circuit, but not other secondary resonant circuits, then the VCO is able to supply n resonant frequencies in response to n number of resonant circuits, and variations to the n resonant frequencies in response to n capacitance circuits. In the event that some or all of the secondary resonant circuits are coupled together, there may be considerably more options. Further, as shown in FIGS. 4, 5A, and 5B, the primary and secondary resonant circuits may further comprise varactors to aid with frequency tuning. One with ordinary skill in the art would be able to design other means of controlling the direction of current flow in the secondary resonant circuit, and other examples are omitted here in the interest of brevity.

Figure 8A:
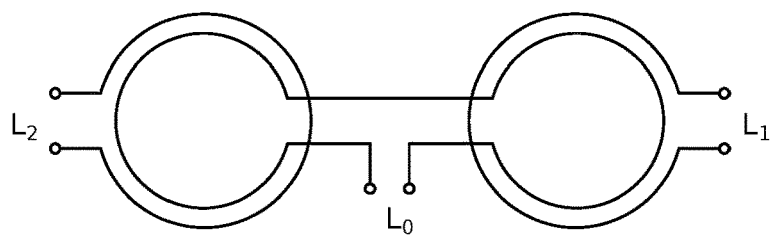
FIGS. 8A and 8B depict different inductor coupling options.
Figure 8B:
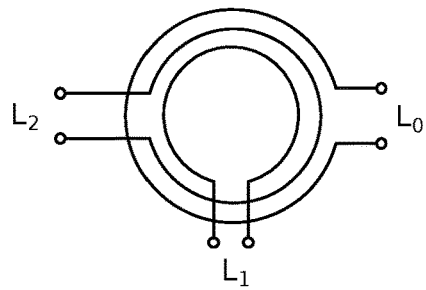

FIGS. 8A and 8B depict different inductor coupling options. At low frequencies the inductors may be conductive wires wound around a ferrite core, for example. But at higher frequencies the inductors are enabled in stripline or microstrip. In FIG. 8A, inductor L0, of the primary resonant circuit for example, is independently coupled to the inductor L1 of a first secondary resonant circuit and L2 of a second secondary resonant circuit. There is no coupling between the L1 and L2 inductors. In contrast, FIG. 8B depicts L0, L1, and L2 being mutually coupled, with the coupling between L0 and L1, and the coupling between L0 and L2, likely being greater than the coupling between L1 and L2.

To summarize, the VCO enables a novel method of controlling the primary and secondary capacitive loading of a transformer to accomplish finer discrete frequency steps, which enables the use of smaller varactors. Moreover, reducing the varactor size reduces VCO gain (Kvco) and reduces the contribution of biasing thermal noise and flicker noise.

Kvco describes the relationship between the total frequency covered by a given output tuning voltage range supplied by the change pump. For example in a phase locked loop (PLL), the output charge pump voltage may range from 200 mV to 600 mV, in which case the PLL is monitoring the VCO's frequency and using feedback to keep the frequency constant. Each capacitance configuration of a VCO has a small range before the PLL tuning voltage cannot be raised above/below 600 mV/200 mV tuning range and the configuration is changed. For example, the operating range may be (12 GHz−10 GHz)/(600 mV−200 mV) or Kvco=2 GHz/V.

Generally, it is beneficial to optimize the PLL to operate with as large as possible output control voltage range while maintaining linearity. That places a burden on the VCO design to break up the capacitor circuit into increasingly smaller unit capacitances, reducing the maximum gap capacitance such that each sub-band covers less frequency over the same control voltage range.

Figure 1:
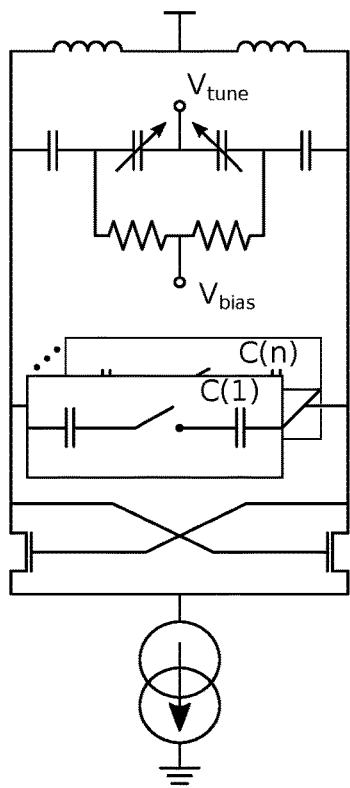
FIG. 1 is a schematic drawing depicting a conventional voltage controlled oscillator (VCO) using a single inductor-capacitor (LC) tank with fixed value capacitors for coarse frequency selection and varactors for fine frequency selection to cover the frequency range (prior art).

A transformer based VCO differs from a conventional LC VCO by the inclusion of an auxiliary amplifier for mode control and coupled inductors. The conventional VCO shown in FIG. 1 utilizes a single LC tank with fine and coarse frequency selection to cover the frequency range. A transformer based VCO has both an even mode and odd mode resonance determined by the phase relationship of the currents in the primary and secondary coils. When operating in the odd mode, the effective inductance is reduced and thus a higher oscillation frequency is obtained. Enforcement of in-phase or anti-phase coupling leads to an upper and lower resonant band, enabling very wideband architectures with the advantage of occupying the area of only a single inductor.

Equation (1) describes the output phase noise due to the thermal noise of varactor biasing resistors. Equation (2) describes the output phase noise due to flicker noise in the bias current. The bias current modulates the output common mode voltage due to the finite inductor resistance ($R_S$) at low frequencies. This is equivalent to a change in control voltage and thus frequency modulation.

$$S_{\phi n}(f) = kTR_b K^2_{VCO}/4\pi^2 f^2 \quad (1)$$

$$S_{\phi n}(f) = ((K_{VCO} R_s/2)(1/2\pi f))^2 (\alpha/f) \quad (2)$$

Equations (1) and (2) demonstrate the usefulness of reducing $K_{VCO}$ with regard to the phase noise performance of the VCO. Targeting a low $K_{VCO}$ while simultaneously achieving ultra-wideband operation requires more discrete capacitor units, larger varactors, or both. The VCO presented herein bridges the gap between discrete frequency bands by introducing additional sub-bands through the asymmetric control of the primary and secondary capacitive loads. The spacing of these additional sub-bands is a function of the transformer coupling coefficient k and the ratio of capacitances on the primary and secondary coils, C1 (206) and C2 (214) respectively.

Figure 9:
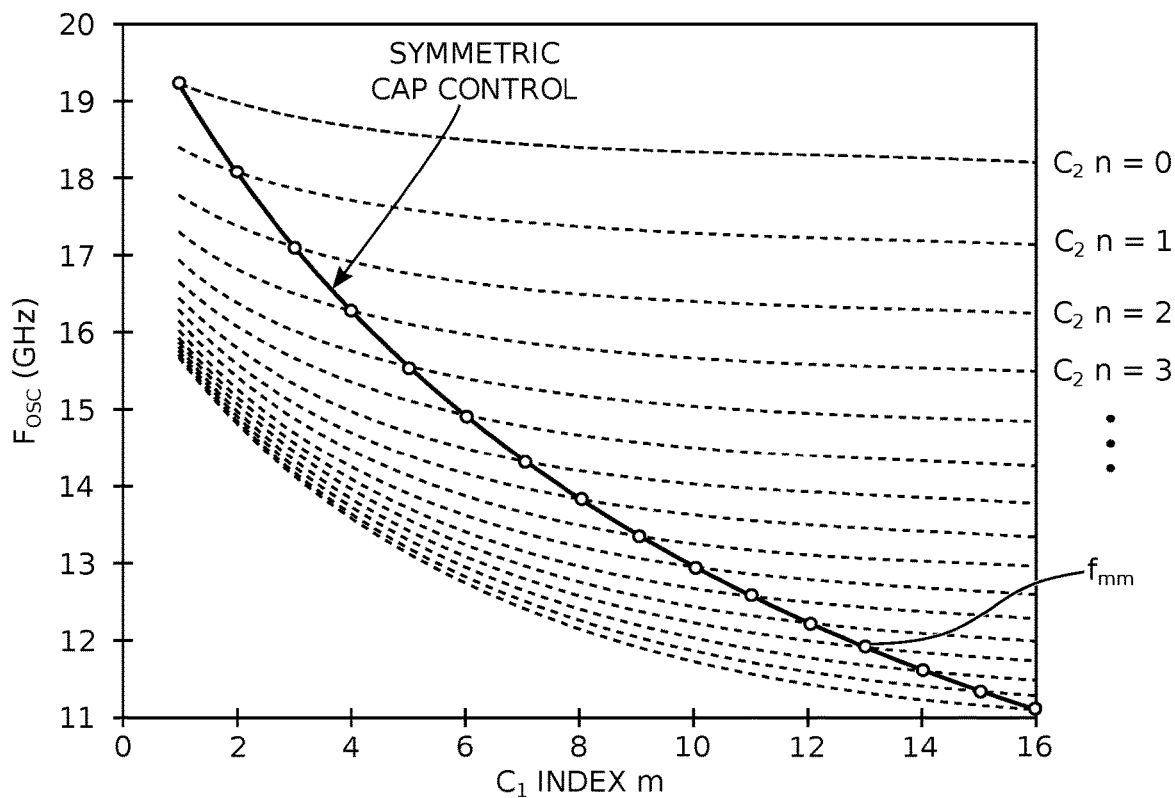
FIG. 9 is a graph depicting the odd mode oscillation frequency for a representative transformer with a mutual coupling k=0.3 and capacitive banks C1 and C2, which are identical and divided into 16 unit capacitance steps Cu.

FIG. 9 is a graph depicting the odd mode oscillation frequency for a representative transformer with a mutual coupling k=0.3 and capacitive banks C1 and C2, which are identical and divided into 16 unit capacitance steps Cu. Symmetric capacitance control leads to the frequencies $F_{OSC}(C1(m), C2(m)) = f_{MM}$. The remaining curves represent $F_{OSC}(C1(m), C2(n)) \forall m, n$ and offer additional discrete solutions. Taking a horizontal slice of the figure defines all solutions of the transformer to oscillate at the desired frequency. For example, if a horizontal ruler is placed at $F_{OSC}=16$, then the intersection of the plotted curves with this horizontal ruler is the solution set of $C1(m),C2(n)$ that yields $F_{OSC}=16$. This example illustrates how one oscillation frequency can be the result of one or more configurations of capacitance, thus providing redundancy.

Figure 10:
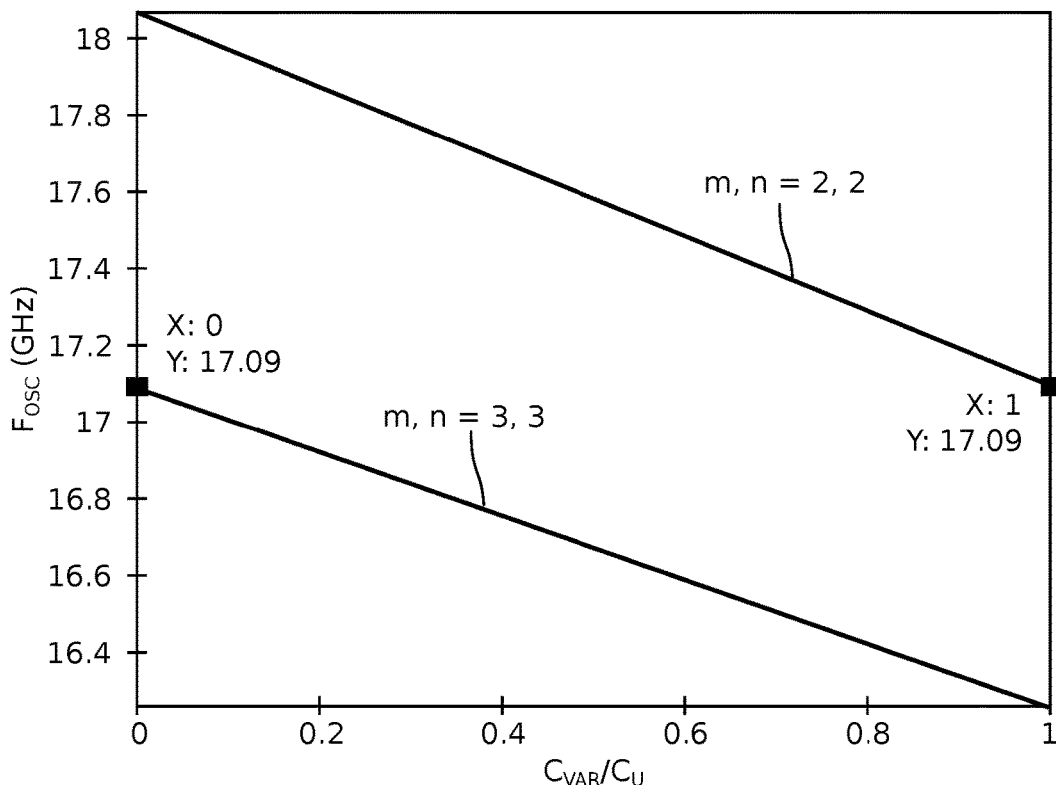
FIG. 10 is a graph depicting an example of two discrete frequency bands for a given varactor size.

FIG. 10 is a graph depicting an example of two discrete frequency bands for a given varactor size. In this example, a minimal amount of band overlap is shown, although this risks the appearance of blind zones due to modeling inaccuracies and pressure, volume, temperature (PVT) effects after actual implementation.

Figure 11:
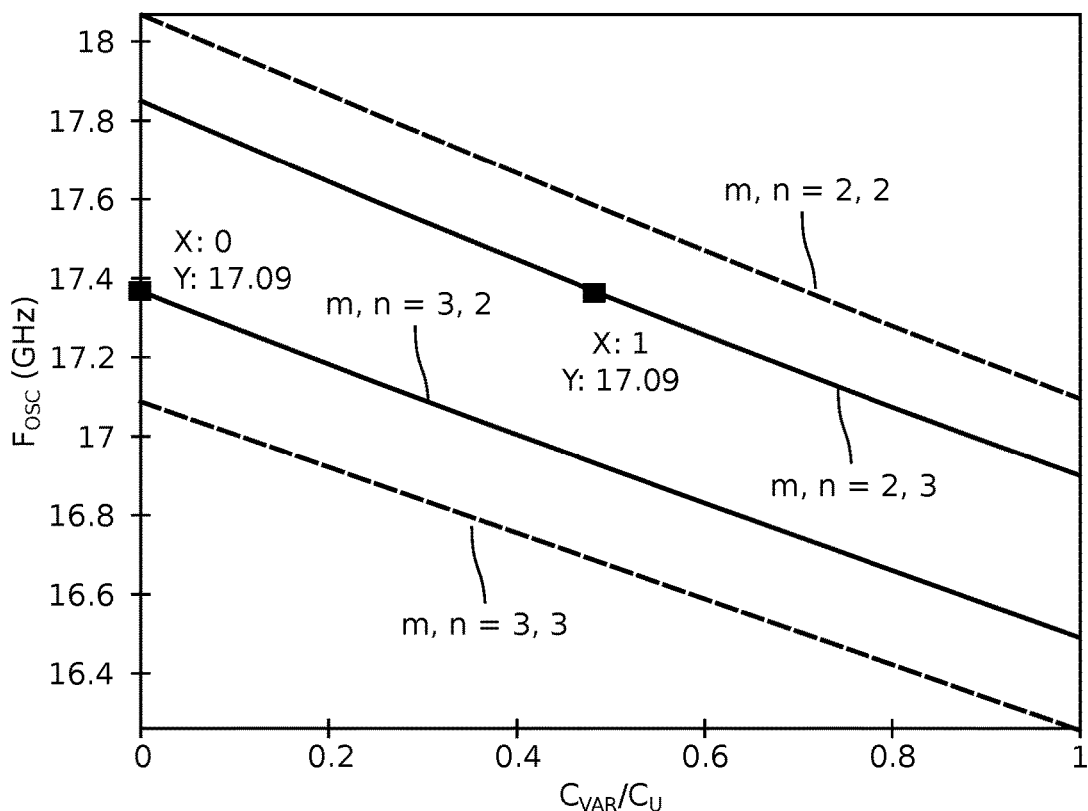
FIG. 11 is a graph depicting two intermediate bands only available through the use of asymmetric loading of a transformer.

FIG. 11 is a graph depicting two intermediate bands only available through the use of asymmetric loading of a transformer. This intermediate band and the transformer's other related configurations create more sub-band overlap for the same discrete capacitance step and varactor sizing. In this example, the additional varactor capacitance (C var) required to continuously tune the output frequency is reduced by half of that conventionally required to achieve full frequency coverage. The asymmetric control facilitates a reduction of $K_{VCO}$ by 2, in this example, reducing the contribution to phase noise of (1) and (2) by 6 dB. In short, a critical observation of the disclosed VCO is that the size of the varactor capacitance range can be reduced to less than a maximum gap capacitance common to conventional VCO schemes.

Figure 12:
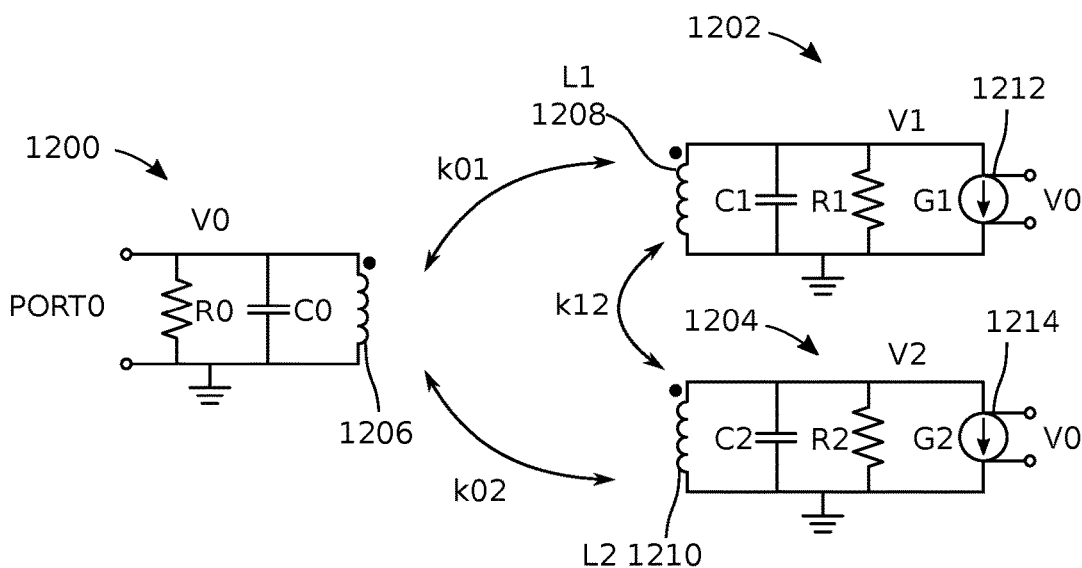
FIG. 12 is a schematic diagram depicting a VCO with a primary resonant circuit and two secondary resonant circuits.

FIG. 12 is a schematic diagram depicting a VCO with a primary resonant circuit 1200 and two secondary resonant circuits 1202 and 1204. The input impedance of the primary resonant circuit, Z11, is measured at PORT0. Inductors L0 1206, L1 1208, and L2 1210 are mutually coupled. G1 1212 and G2 1214 are mode (current) control elements. More explicitly, G1 and G2 are voltage controlled current sources (VCCS). They take a voltage input v0 and convert it to a current with a gain of gm. This gain gm can be positive, negative, or zero. They output a current that is proportional to (gm)(v0), injecting a current that is related to the voltage v0 into the various cores.

When the schematic details are viewed this way, it can be said that the output voltage of the primary is electrically coupled to the secondary whose impedance is magnetically coupled back to the primary. This feedback loop is how the impedance seen at PORT0 can be altered. The electrical coupling is unidirectional, while the magnetic coupling is bidirectional. v0 is the voltage across the primary inductor L0. That voltage is then transformed to a current by the elements G0/G1 and a proportionality constant called gm. Again, gm can be positive or negative, implying that the applied current by these instances is either in-phase/anti-phase with respect to the voltage and current in the primary. The polarity and magnitude of gm helps vary the effective impedance seen at the primary L0.

The design variables are presented below in Table 1.

TABLE 1

Design Variables

| | Name | Value |
|---|---|---|
| 1 | k12 | 300 m |
| 2 | k02 | 600 m |
| 3 | k01 | 200 m |
| 4 | gm2x | 0 |
| 5 | gm1x | 0 |
| 6 | Rtank | 400 |

TABLE 1-continued

Design Variables

| | Name | Value |
|---|---|---|
| 7 | Q2 | 200 |
| 8 | Q1 | 200 |
| 9 | Q0 | 200 |
| 10 | Ltank2 | 400 p |
| 11 | Ltank1 | 300 p |
| 12 | Ltank0 | 300 p |
| 13 | Cvar | 10 f |
| 14 | Ctank | 500 f |
| 15 | Rtank2 | Q2*15e9*2*3.14*Ltank2 |
| 16 | Rtank1 | Q1*15e9*2*3.14*Ltank1 |
| 17 | Rtank0 | Q0*15e9*2*3.14*Ltank0 |
| 18 | gm2 | gm2x/Rtank2 |
| 19 | gm1 | gm1x/Rtank1 |

Figure 13:
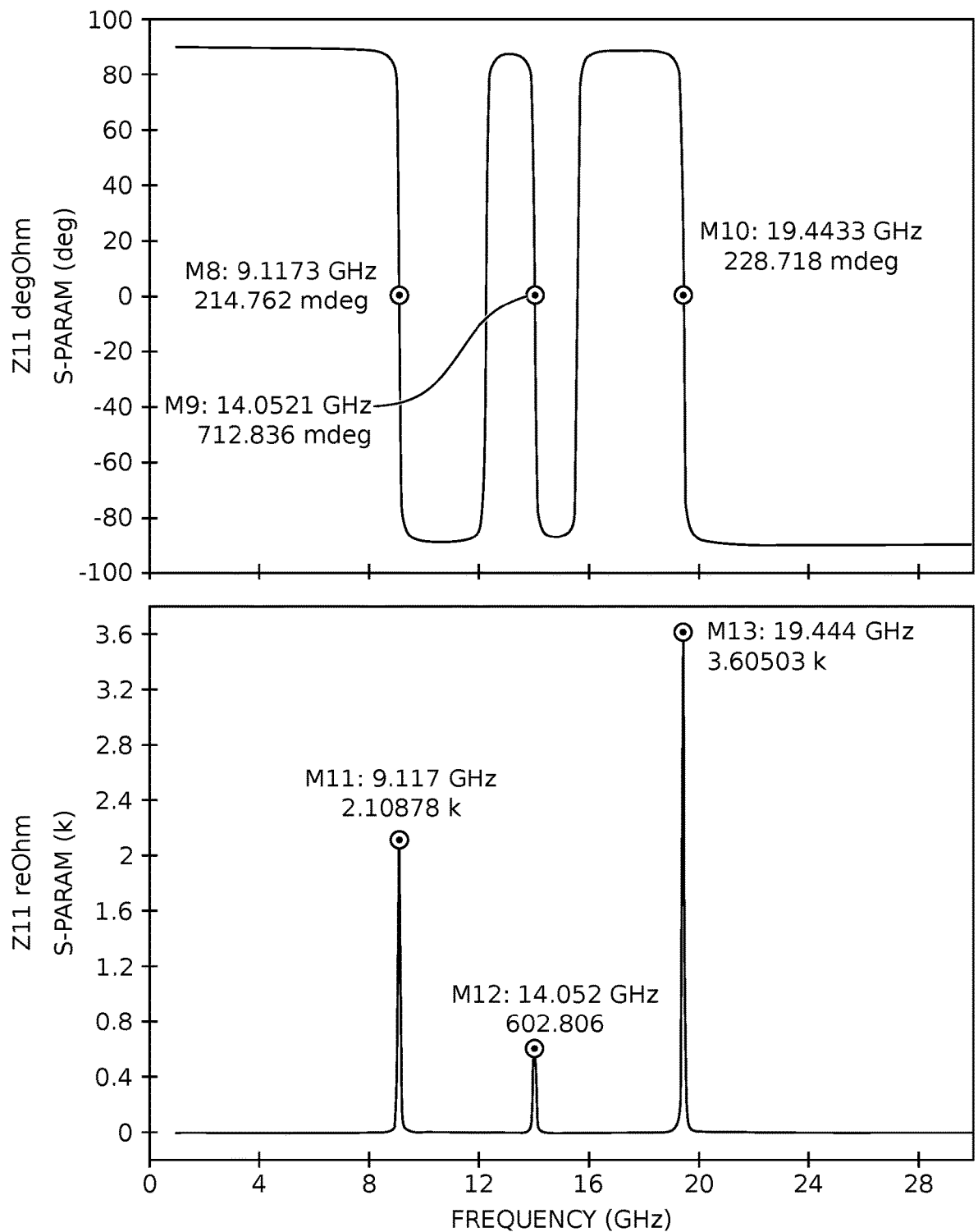
FIG. 13 is a graph depicting the primary resonant circuit input impedance of FIG. 12, referenced to frequency.

FIG. 13 is a graph depicting the primary resonant circuit input impedance of FIG. 12, referenced to frequency. The VCO oscillates at any frequency for which the input impedance phase is 0 degrees. At this frequency, the reactive components (L and C) are equal and the energy oscillates between the two components in the absence of loss. It is the VCO designer's goal to negate any loss associated with the inductor/capacitors at the oscillation frequency such that oscillation is sustained. The Z11 degOhm graph shows the input impedance phase toggling between +90 and −90 degrees. This is because below the oscillation frequency of a simple LC tank, the phase of impedance is positive (+ve reactance inductor dominated), 0 at oscillation frequency (purely real), and negative above the oscillation frequency eve reactance capacitor dominated). In the plot the Z11 phase crosses the 0 degree point 6 times, where 3 of these crossings correspond to peaks in the real part impedance Z11 reOhm. These peaks are candidates for sustained oscillation in practice because the loss can be compensated for with active circuitry. The strength of these resonant frequencies and their spacings are functions of the inductances and capacitances and their mutual coupling factors k, as well as the strength/phase of the current selection circuits. k01, for example, is the coupling coefficient between inductors L0 and L1. The parameters k01, k02, and k12 can be positive, negative, or even zero (indicating no magnetic coupling). The real impedance peaks are a result of the complex impedance evolving over frequency. The physical explanation is that this configuration is the summation of distinct resonators, each with a frequency dependent complex impedance. From a single port point of view, the final impedance after all interactions is presented. Through the frequency range, certain parts of the circuit dominate the complex impedance and then fall to the background in other parts of the spectrum.

It is probably more practical to correlate the number of resonant frequencies to the number of cores (resonant circuits) instead of the various configurations of the mode control. The mode control circuits vary the effective impedance of the oscillator through highly complicated interactions that are not presented here in the interest of brevity. For example, a simple two core coupled oscillator has two zeros and four poles. A three core coupled network would have four zeros and eight poles, etc.

Figure 14:
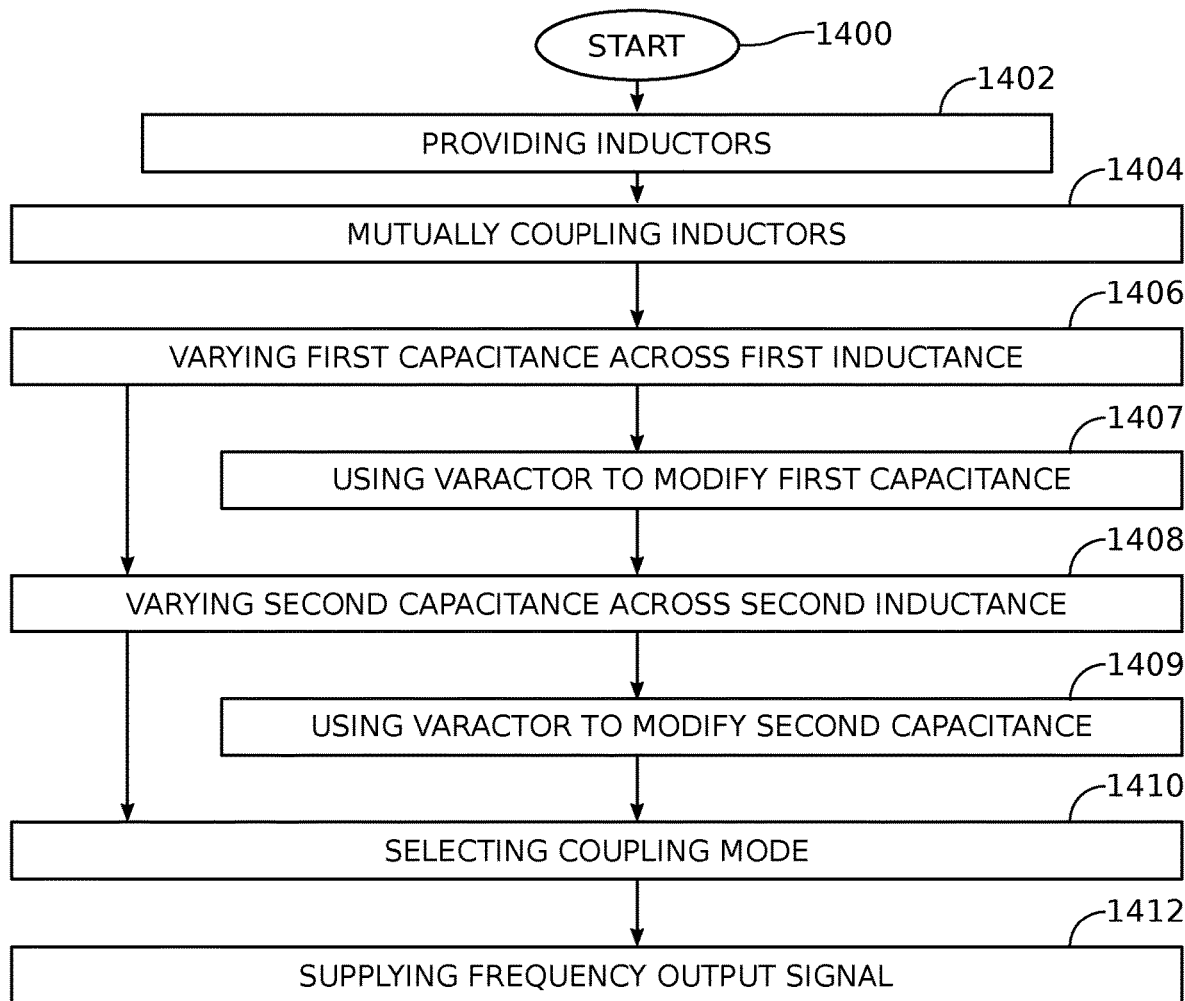
FIG. 14 is a flowchart illustrating a transformer based method for voltage controlled oscillation.

FIG. 14 is a flowchart illustrating a transformer based method for voltage controlled oscillation. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps and should be understood with consideration of the above-described device figures. The method starts at Step 1400.

Step 1402 provides a first inductor and a second inductor. Step 1404 mutually couples the first and second inductors. Step 1406 varies a first capacitance across the first inductor. Step 1408 varies a second capacitance across the second inductor. Step 1410 selects either an odd mode or an even mode of mutual inductance. Step 1412 supplies a variable (selectable) frequency output signal responsive to the mode of mutual inductance, the first capacitance, and the second capacitance.

In one aspect, supplying the variable frequency output signal in Step 1412 includes supplying a first resonant frequency in response to even mode operation. Alternatively, a second resonant frequency is supplied, greater than the first resonant frequency, in response to odd mode operation. Variations to the first and second resonant frequencies are responsive to the first and second capacitances.

In another aspect, Step 1407 uses a first varactor to modify the first capacitance, and Step 1409 uses a second varactor to modify the second capacitance. Typically, Step 1406 varies the first capacitance by increasing the capacitance in consecutive first capacitance steps. Then, in Step 1407 the first varactor modifies the first capacitance less than the largest first capacitance step. Likewise, Step 1408 may vary the second capacitance by increasing the capacitance in consecutive second capacitance steps. Then, in Step 1409 the second varactor modifies the second capacitance less than the largest second capacitance step.

In more detail, Step 1412 supplies a first continuous range of frequencies, ascending from the first resonant frequency, in response to even mode operation, the first and second capacitances, and varactor modifications of the first and second capacitances. Alternatively, Step 1412 supplies a second continuous range of frequencies, ascending from the second resonant frequency, in response to even mode operation, the first and second capacitances, and varactor modifications of the first and second capacitances. In one aspect, the combination of the first and second continuous range of frequencies forms a third continuous range of frequencies.

In another aspect, varying the first capacitance in Step 1406 includes forming a network of selectable fixed value capacitors having a minimum first quality factor (Q) value. Likewise, Step 1408 forms a network of selectable fixed value capacitors having the minimum second Q value. Then, using the first varactor to modify the first capacitance in Step 1407 includes using a first varactor having a maximum third Q value less than the minimum first Q value. Likewise, using the second varactor to modify the second capacitance in Step 1409 includes using a second varactor having a maximum fourth Q value less than the minimum third Q value. Thus, Step 1407 minimizes the capacitive tuning range of the first varactor to provide a maximum fifth Q value greater than the maximum third Q value, and Step 1409 minimizes the capacitive tuning range of the second varactor to provide a maximum sixth Q value greater than the maximum fourth Q value. The result is that Step 1412 supplies the variable frequency output signal with an increased Q values in response to minimized first and second varactor capacitive tuning ranges.

Alternatively stated, if the size of the capacitor steps are reduced in Steps 1406 and 1408, then Step 1412 supplies the variable frequency output signal with a decreased voltage controlled oscillation gain (Kvco), decreased resistor noise, and decreased flicker noise in response to reducing the size of the first and second capacitance steps.

Generally, Step 1402 may provide n inductors that can be mutually coupled in Step 1404, and Step 1406 and 1408 vary the capacitances across the n inductors, so that Step 1412 is able to supply n possible resonant output signal frequencies responsive to n resonant circuits.

A system and method have been provided for a transformer based VCO. Examples of particular hardware units have been presented to illustrate the invention. However, the invention is not limited to merely these examples. Other variations and embodiments of the invention will occur to those skilled in the art.

I claim:

1. A transformer based voltage controlled oscillator (VCO) comprising:
    a primary resonant circuit comprising a first inductor connected in parallel with a variable first capacitance circuit;
    a first secondary resonant circuit comprising a second inductor connected in parallel with a variable second capacitance circuit;
    a mode control circuit exclusively connected to the first secondary resonant circuit;
    wherein the primary resonant circuit and first secondary resonant circuit are exclusively mutually coupled through the first and second inductors in a manner selected from the group consisting of an even mode or an odd mode in response to the mode control circuit; and,
    wherein the VCO supplies a variable frequency output signal responsive to the mutual inductance of the first and second inductors, the first capacitance circuit, and the second capacitance circuit.

2. The VCO of claim 1 wherein the first capacitance circuit comprises a first bank of selectively engageable fixed-value capacitors; and,
    wherein the second capacitance circuit comprises a second bank of selectively engageable fixed-value capacitors.

3. The VCO of claim 1 wherein the VCO supplies a first resonant frequency in response to even mode operation, and a second resonant frequency, greater than the first resonant frequency, in response to odd mode operation, with variations to the first and second resonant frequencies responsive to the first and second capacitance circuits.

4. The VCO of claim 1 further comprising:
    a first electrically tunable varactor shunted across the first capacitance circuit; and,
    a second electrically tunable varactor shunted across the second capacitance circuit.

5. The VCO of claim 4 wherein the VCO supplies a first continuous range of frequencies, ascending from the first resonant frequency, in response to even mode operation, the first and second capacitance circuits, and electrically tuned capacitance values of the first and second varactors; and,
    wherein the VCO supplies a second continuous range of frequencies, ascending from the second resonant frequency, in response to odd mode operation, the first and second capacitance circuits, and electrically tuned capacitance values of the first and second varactors.

6. The VCO of claim 5 wherein the first and second continuous range of frequencies, when combined, form a third continuous range of frequencies.

7. The VCO of claim 1 further comprising:
(n−1) number of secondary resonant circuits, each resonant circuit comprising a mutually coupled inductor and a variable capacitance circuit;
a mode control circuit connected to each secondary resonant circuit; and,
wherein the VCO supplies n resonant frequencies in response to n mode options, and variations to the n resonant frequencies in response to n capacitance circuits.

8. The VCO of claim 7 further comprising:
an electrically tunable varactor shunted across each corresponding capacitance circuit.

9. The VCO of claim 1 wherein the mode control circuit comprises a maximum of two current control elements.

10. A transformer based method for voltage controlled oscillation, the method comprising:
providing a first inductor and a second inductor;
varying a first capacitance across the first inductor to form a primary resonant circuit;
varying a second capacitance across the second inductor to form a first secondary resonant circuit;
exclusively coupling the primary resonant circuit with the first secondary resonant circuit through the first and second inductors;
selecting a mode of coupling from the group consisting of an odd mode and an even mode by controlling a direction of current flow exclusively in the first secondary resonant circuit; and,
supplying a variable frequency output signal responsive to the mode of coupling, the first capacitance, and the second capacitance.

11. The method of claim 10 wherein controlling the direction of current flow in the first secondary resonant circuit includes controlling current with a maximum of two current control elements.

12. The method of claim 10 wherein supplying the variable frequency output signal includes supplying a first resonant frequency in response to even mode operation, or a second resonant frequency, greater than the first resonant frequency, in response to odd mode operation, with variations to the first and second resonant frequencies in response to the first and second capacitances.

13. The method of claim 10 further comprising:
using a first varactor, modifying the first capacitance; and,
using a second varactor, modifying the second capacitance.

14. The method of claim 13 wherein supplying the variable frequency output signal includes:
supplying a first continuous range of frequencies, ascending from the first resonant frequency, in response to even mode operation, the first and second capacitances, and varactor modifications of the first and second capacitances; and,
supplying a second continuous range of frequencies, ascending from the second resonant frequency, in response to odd mode operation, the first and second capacitances, and varactor modifications of the first and second capacitances.

15. The method of claim 14 wherein supplying the variable frequency output signal includes the combination of the first and second continuous range of frequencies forming a third continuous range of frequencies.

16. The method of claim 13 wherein varying the first capacitance includes increasing the capacitance in consecutive first capacitance steps;
wherein using the first varactor to modify the first capacitance includes modifying the first capacitance less than the largest first capacitance step;
wherein varying the second capacitance includes varying the capacitance in consecutively increasing second capacitance steps; and,
wherein using the second varactor to modify the second capacitance includes modifying the second capacitance less than the largest second capacitance step.

17. The method of claim 10 wherein providing the first inductor and second inductors includes provide n inductors;
wherein varying the capacitance across the first and second inductors includes varying the capacitance across the n inductors to form n resonant circuits;
wherein exclusively coupling the primary resonant circuit with the first secondary resonant circuit through the first and second inductors includes exclusively coupling the n resonant circuits through the n inductors; and,
wherein supplying the variable frequency output signal includes supplying n possible resonant output signal frequencies responsive to n resonant circuits.

18. The method of claim 17 further comprising:
using a varactor to modify each corresponding capacitance.

19. A transformer based voltage controlled oscillator (VCO) comprising:
a primary resonant circuit comprising a first inductor connected in parallel with a variable first capacitance circuit;
a first secondary resonant circuit comprising a second inductor connected in parallel with a variable second capacitance circuit;
a mode control circuit comprising a maximum of two current control elements;
wherein the primary resonant circuit and first secondary resonant circuit are exclusively mutually coupled through the first and second inductors in a manner selected from the group consisting of an even mode or an odd mode in response to the mode control circuit; and,
wherein the VCO supplies a variable frequency output signal responsive to the mutual inductance of the first and second inductors, the first capacitance circuit, and the second capacitance circuit.

20. The VCO of claim 19 wherein the mode control circuit is exclusively connected to the first secondary resonant circuit.

21. The VCO of claim 19 wherein the first capacitance circuit comprises a first bank of selectively engageable fixed-value capacitors; and,
wherein the second capacitance circuit comprises a second bank of selectively engageable fixed-value capacitors.

22. The VCO of claim 19 wherein the VCO supplies a first resonant frequency in response to even mode operation, and a second resonant frequency, greater than the first resonant frequency, in response to odd mode operation, with variations to the first and second resonant frequencies responsive to the first and second capacitance circuits.

23. The VCO of claim 19 further comprising:
a first electrically tunable varactor shunted across the first capacitance circuit; and,
a second electrically tunable varactor shunted across the second capacitance circuit.

24. The VCO of claim 23 wherein the VCO supplies a first continuous range of frequencies, ascending from the first resonant frequency, in response to even mode operation, the first and second capacitance circuits, and electrically tuned capacitance values of the first and second varactors; and, wherein the VCO supplies a second continuous range of frequencies, ascending from the second resonant frequency, in response to odd mode operation, the first and second capacitance circuits, and electrically tuned capacitance values of the first and second varactors.

25. The VCO of claim 24 wherein the first and second continuous range of frequencies, when combined, form a third continuous range of frequencies.

26. The VCO of claim 19 further comprising:
   (n−1) number of secondary resonant circuits, each resonant circuit comprising a mutually coupled inductor and a variable capacitance circuit;
   a mode control circuit connected to each secondary resonant circuit; and,
   wherein the VCO supplies n resonant frequencies in response to n mode options, and variations to the n resonant frequencies in response to n capacitance circuits.

27. The VCO of claim 26 further comprising:
   an electrically tunable varactor shunted across each corresponding capacitance circuit.

28. A transformer based method for voltage controlled oscillation, the method comprising:
   providing a first inductor and a second inductor;
   varying a first capacitance across the first inductor to form a primary resonant circuit;
   varying a second capacitance across the second inductor to form a first secondary resonant circuit;
   using a first varactor, modifying the first capacitance;
   using a second varactor, modifying the second capacitance exclusively coupling the primary resonant circuit with the first secondary resonant circuit through the first and second inductors;
   selecting a mode of coupling from the group consisting of an odd mode and an even mode;
   supplying a variable frequency output signal responsive to the mode of coupling, the first capacitance, and the second capacitance as follows:
      supplying a first continuous range of frequencies, ascending from the first resonant frequency, in response to even mode operation, the first and second capacitances, and varactor modifications of the first and second capacitances; and,
      supplying a second continuous range of frequencies, ascending from the second resonant frequency, in response to odd mode operation, the first and second capacitances, and varactor modifications of the first and second capacitances.

29. The method of claim 28 wherein selecting the mode of coupling includes controlling a direction of current flow exclusively in the first secondary resonant circuit.

30. The method of claim 29 wherein controlling the direction of current flow in the first secondary resonant circuit includes controlling current with a maximum of two current control elements.

31. The method of claim 28 wherein supplying the variable frequency output signal includes supplying a first resonant frequency in response to even mode operation, or a second resonant frequency, greater than the first resonant frequency, in response to odd mode operation, with variations to the first and second resonant frequencies in response to the first and second capacitances.

32. The method of claim 28 wherein supplying the variable frequency output signal includes the combination of the first and second continuous range of frequencies forming a third continuous range of frequencies.

33. The method of claim 28 wherein varying the first capacitance includes increasing the capacitance in consecutive first capacitance steps;
   wherein using the first varactor to modify the first capacitance includes modifying the first capacitance less than the largest first capacitance step;
   wherein varying the second capacitance includes varying the capacitance in consecutively increasing second capacitance steps; and,
   wherein using the second varactor to modify the second capacitance includes modifying the second capacitance less than the largest second capacitance step.

34. The method of claim 28 wherein providing the first inductor and second inductors includes provide n inductors;
   wherein varying the capacitance across the first and second inductors includes varying the capacitance across the n inductors to form n resonant circuits;
   wherein exclusively coupling the primary resonant circuit with the first secondary resonant circuit through the first and second inductors includes exclusively coupling the n resonant circuits through the n inductors; and,
   wherein supplying the variable frequency output signal includes supplying n possible resonant output signal frequencies responsive to n resonant circuits.

35. The method of claim 34 further comprising:
   using a varactor to modify each corresponding capacitance.

* * * * *